SEMICONDUCTOR DIODE AND METHOD OF MAKING

Filed Dec. 12, 1963

INVENTOR
R. L. JOHNSTON
BY H. V. Lockhart
ATTORNEY

United States Patent Office 3,310,858

Patented Mar. 28, 1967

3,310,858

SEMICONDUCTOR DIODE AND METHOD OF MAKING

Ralph L. Johnston, South Plainfield, N.J., assignor to Bell Telephone Laboratories, Incorporated, New York, N.Y., a corporation of New York Filed Dec. 12, 1963, Ser. No. 330,189
1 Claim. (Cl. 29—25.3)

Figure 1:
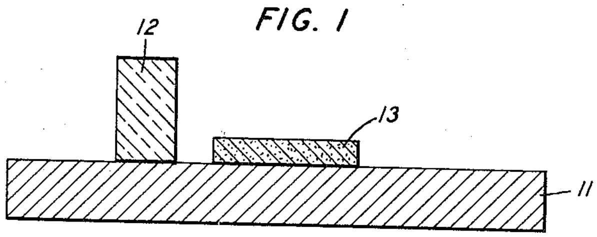

This invention relates to a semiconductor diode of the surface barrier type and to the method of making such a diode.

There is continuing need for reliable and easily fabricated semiconductor devices and particularly for fabrication methods which produce devices having uniformly reproducible electrical characteristics.

Accordingly, an object of this invention is an improved semiconductor diode and particularly one which is easily fabricated.

This invention is based in one aspect, on the discovery that the copper plating technique disclosed in the application of D. L. Klein, Serial No. 265,612, filed Mar. 18, 1963, now Patent 3,224,904, issued Dec. 21, 1965, and assigned to the same assignee of this application, is an advantageous initial step for making an improved diode of the surface barrier junction type. The method in accordance with this invention involves producing, by displacement, a thin copper plating on the surface of a wafer of silicon semiconductor material. A wire electrode of a suitable metal such as palladium then is pressure bonded on one face of the copper plated wafer. The wafer then is treated in a concentrated nitric acid etch which removes the copper plating except for the portion under the pressure bonded metal electrode. After suitable encapsulation, the resulting structure constitutes a semiconductor diode having, among its other advantageous characteristics, uniformly good reverse recovery characteristics for switching applications.

Accordingly, features of this diode structure and the method of achieving it are the relatively simple steps of copper plating followed by a pressure bonding operation to produce a stable, uniformly excellent surface barrier junction.

The invention and its other objects and features will be more clearly understood from the following detailed description taken in connection with the drawing in which:

FIGS. 1 through 4 are cross section views of one arrangement in accordance with this invention showing the successive steps in the fabrication of an encapsulated surface barrier diode.

Referring to FIG. 1, the device assembly begins with the mounting of a small stand-off element 12 of quartz which is thermocompression bonded at an elevated temperature to a metal base member 11 of gold-plated molybdenum. To facilitate this bonding and subsequent lead bonding, both end faces of the element 12 are previously gold plated. A silicon semiconductor wafer 13 then is pressure bonded at a slightly lower temperature to the base member 11. Typically, the silicon wafer 13 is about ten mils square and about five to ten mils thick. In accordance with well-known practice current in the art, the wafer has a thin upper surface layer of silicon formed by epitaxial film growth, the film having a thickness of from less than one micron to about two microns. The original substrate silicon on which the film is grown is of N-type conductivity having a resistivity of .001 ohm centimeter. The resistivity of the epitaxial film is much higher and may be about 1 to 1.5 ohm centimeters. As is well known to those skilled in the art, the electrical characteristics of the semiconductor diode are, in part, a function of both the epitaxial film thickness and its resistivity, and both parameters may be adjusted to achieve the desired results.

Figure 2:
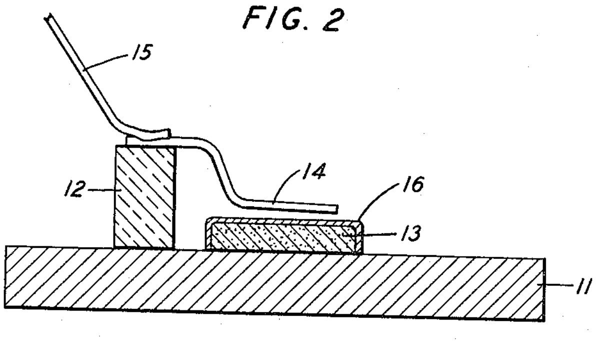

The fabrication of the device is continued as shown in FIG. 2 with the pressure bonding of a one-half mil diameter wire 14 of palladium and a two mil diameter wire 15 of gold to the top surface of the quartz element 12. The opposite ends of both wires 14 and 15 are unattached at this stage of fabrication. Next, using the displacement copper plating technique disclosed in the above-identified application of D. L. Klein, the silicon wafer 13 is plated with a copper coating of from 2,000 to 5,000 angstroms in thickness. The Klein invention is directed to a technique for providing a very high quality surface on a silicon slice by subsequent removal of the thus produced copper plating. However, in accordance with this invention, the copper plating 16 remains, in part at least, on the silicon wafer to provide a surface barrier junction.

The displacement plating bath typically is a solution of 48 percent hydrofluoric acid with one-tenth of one percent copper sulfate salt dissolved in the solution. The treatment time is of the order of seconds, typically from three to five seconds and is followed by a water and alcohol rinse. It will be understood that satisfactory copper platings by the displacement technique may be produced using a variety of copper salt concentrations. The solution set forth herein is preferred for its simplicity and for a somewhat more adherent layer of copper. If the copper salt concentration is varied, it will, of course, follow that the plating time must likewise be varied. A very dilute bath may require as much as thirty seconds to achieve desired plating thickness. In general, thicker platings have been found unsatisfactory because of their tendency to peel away from the silicon surface.

Figure 3:
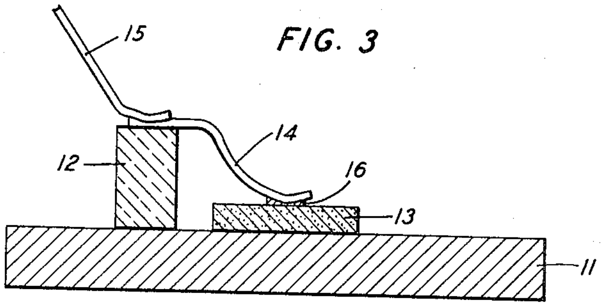

Referring to FIG. 3, the next operation is the thermocompression bonding of the wire electrode 14 of palladium to the copper plated surface. This is done using a bonding tool of a type now well known in the art at an ambient temperature of from 400 to 450 degrees centigrade using a pressure of approximately 50,000 p.s.i. Typically, the tool is a polished, flattened quartz rod which in this instance flattens a portion of the palladium wire so as to form a bonded area approximately equal to a one mil diameter circle. Advantageously, the bonding is done in a forming gas atmosphere. This bonding operation is a significant feature of the invention and, apparently, not only firmly bonds the wire electrode to the copper plated surface, but assures good adherence of the underlying copper film to the silicon bond. Mechanical and electrical tests indicate that this pressure bonding is important in the production of uniformly satisfactory devices.

The next processing step is to subject the assembly, particularly the silicon wafer 13 to a concentrated nitric acid etch which, in a fraction of a second, removes the copper coating 16 except for the portion underlying the bonded area of the palladium wire electrode 14. In FIG. 3 this limited portion of the remaining copper film 16 is shown as having a significant thickness. This is, of course, purely for explanatory purposes inasmuch as the film is only a few thousand angstroms in thickness which is difficult to detect even with magnification. However, this structural arrangement of flattened wire electrode, thin copper film and epitaxial silicon layer in the semiconductor element constitutes the rectifying portion of the device. Advantageously, the semiconductor device may be tested at this stage to determine whether it has the characteristics desired prior to the final encapsulation. In fact, if the device fails to meet electrical requirements at this point, it is possible simply to replate the wafer and repeat the bonding and etching steps to reconstitute a satisfactory device.

Figure 4:
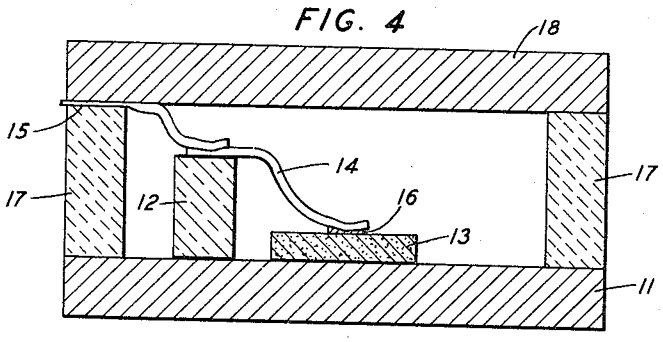

Finally, as illustrated in FIG. 4, the diode is completely encapsulated by bonding a ceramic ring 17 to the base member 11 and in turn bonding a molybdenum cap member 18 to make the final closure, including pressure bonding the gold wire 15 between the cap and ceramic. Thus, the two end metal members constitute the terminals of the diode. The completed encapsulation may be of exceedingly small dimensions, typically 50 mils in diameter and 50 mils in total thickness.

It will be understood that although the invention has been described in terms of a device utilizing a bonded wire electrode, other variations may be used such as bonding a small pellet and then attaching a wire lead after etching. Moreover, a wide variety of metals for bonding to the copper plating have been found satisfactory. For example, in addition to palladium, platinum, nickel, silver and copper have been used with satisfactory results. In general, it would appear that any metal having characteristics which permit the application of sufficient bonding force to properly adhere the underlying copper, as well as providing resistance to the several chemical treatments might be used. The use of the stand-off element 12 is described and claimed in the application of C. E. Golightly, Ser. No. 327,767, filed Dec. 3, 1963, assigned to the same assignee as this application, and is employed here for the obvious advantages offered in the fabrication procedure.

Although the invention has been described in certain specific terms, it will be understood that other arrangements and procedures may be devised by those skilled in the art which likewise will be within the scope and spirit of the invention.

What is claimed is:

A method of fabricating a silicon semiconductor diode comprising immersing a body of silicon semiconductor material in a copper sulphate-hydrofluoric acid solution for a period of several seconds to provide a plating of copper having a thickness of from about 2000 to 5000 angstroms, removing the body from said solution, then bonding a metal electrode selected from the group consisting of palladium, platinum, nickel, silver and copper to a limited portion of the copper plating on said body at a temperature of from about 400 to 450 degrees centigrade and a pressure of about 50,000 p.s.i. and then treating said copper plated surface with concentrated nitric acid to remove said copper plate except where it underlies said bonded electrode.

References Cited by the Examiner

UNITED STATES PATENTS

| | | | |
|---|---|---|---|
| 2,771,382 | 11/1956 | Fuller | 148—1.5 |
| 2,869,057 | 1/1959 | Allison | 317—237 |
| 2,878,147 | 3/1959 | Beale | 29—25.3 |
| 3,006,067 | 10/1961 | Anderson | 29—470 |
| 3,114,088 | 12/1963 | Abercrombie | 317—237 |
| 3,172,785 | 3/1965 | Jochems | 29—25.3 |
| 3,217,401 | 11/1965 | White | 29—155.5 XR |

JOHN F. CAMPBELL, *Primary Examiner.*

CHARLIE T. MOON, WILLIAM I. BROOKS, *Examiners.*